United States Patent
Urabe et al.

(10) Patent No.: US 11,146,191 B2
(45) Date of Patent: *Oct. 12, 2021

(54) SIMULATION DEVICE, SIMULATION METHOD, AND SIMULATION PROGRAM FOR A MOTOR CONTROL DEVICE

(71) Applicant: OMRON Corporation, Kyoto (JP)

(72) Inventors: Kentaro Urabe, Kusatsu (JP); Mamoru Egi, Otsu (JP)

(73) Assignee: OMRON Corporation, Kyoto (JP)

( * ) Notice: Subject to any disclaimer, the term of this patent is extended or adjusted under 35 U.S.C. 154(b) by 237 days.

This patent is subject to a terminal disclaimer.

(21) Appl. No.: 16/485,782

(22) PCT Filed: Jan. 30, 2018

(86) PCT No.: PCT/JP2018/002907
§ 371 (c)(1),
(2) Date: Aug. 13, 2019

(87) PCT Pub. No.: WO2018/163663
PCT Pub. Date: Sep. 13, 2018

(65) Prior Publication Data
US 2020/0052622 A1    Feb. 13, 2020

(30) Foreign Application Priority Data
Mar. 9, 2017  (JP) .............................. JP2017-045406

(51) Int. Cl.
*H02P 6/34* (2016.01)
*G06F 30/20* (2020.01)

(52) U.S. Cl.
CPC ................ *H02P 6/34* (2016.02); *G06F 30/20* (2020.01)

(58) Field of Classification Search
CPC .................................. H02P 6/34; G06F 30/20
See application file for complete search history.

(56) References Cited

U.S. PATENT DOCUMENTS

2004/0183494 A1* 9/2004 Nagaoka ............... G05B 19/19
                                                                        318/632
2015/0323924 A1* 11/2015 Nagaoka ............. G05B 19/404
                                                                        700/275

FOREIGN PATENT DOCUMENTS

EP        3220216        9/2017
EP        3220217        9/2017
(Continued)

OTHER PUBLICATIONS

"International Search Report (Form PCT/ISA/210) of PCT/JP2018/002907," dated May 1, 2018, with English translation thereof, pp. 1-3.
(Continued)

*Primary Examiner* — Eunhee Kim
(74) *Attorney, Agent, or Firm* — JCIPRNET

(57) ABSTRACT

A simulation device includes: a simulation system including a predetermined feedback system having at least a predetermined control block structure corresponding to a predetermined device-side configuration; a holding unit holding impulse response information for calculation that is information on an impulse response relating to the predetermined device-side configuration; a first response calculation unit calculating a time response of the predetermined device-side configuration to a predetermined input value by convolution processing using the impulse response information for calculation and the predetermined input value; and a second response calculation unit calculating a response of the simulation system to a command value input to the simulation system by using the time response of the predetermined device-side configuration calculated by the first response calculation unit. According to this configuration, simulation accuracy of a control system is improved.

14 Claims, 12 Drawing Sheets

(56) References Cited

FOREIGN PATENT DOCUMENTS

| JP | 2006340480 | 12/2006 |
|---|---|---|
| JP | 2008217055 | 9/2008 |
| JP | 2009122779 | 6/2009 |

OTHER PUBLICATIONS

"Written Opinion of the International Searching Authority (Form PCT/ISA/237) of PCT/JP2018/002907," dated May 1, 2018, with English translation thereof, pp. 1-7.
Okyay Kaynak et al., "Model predictive heuristic control of a position servo system in robotics application", IEEE Journal on Robotics and Automation, Oct. 1987, pp. 1-5.
"Search Report of Europe Counterpart Application", dated Nov. 9, 2020, pp. 1-11.

* cited by examiner

SIMULATION DEVICE, SIMULATION METHOD, AND SIMULATION PROGRAM FOR A MOTOR CONTROL DEVICE

CROSS-REFERENCE TO RELATED APPLICATION

This application is a 371 of international application of PCT application serial no. PCT/JP2018/002907, filed on Jan. 30, 2018, which claims the priority benefit of Japanese Patent application serial no. 2017-045406, filed on Mar. 9, 2017. The entirety of each of the abovementioned patent applications is hereby incorporated by reference herein and made a part of this specification.

BACKGROUND

Technical Field

The present invention relates to a technique of simulating a control system, the control system having a control object including a motor and a motor control device controlling the motor.

Related Art

In a servo mechanism, generally, in order to properly control a motor for driving a load device, control parameters (position gain, speed gain, filter cutoff frequency, etc.) of a servo driver controlling the motor are adjusted. An adjustment method of such control parameters can be exemplified by a method performed by actually driving the motor or the load device. In the adjustment method, a control parameter is set for a motor control device such as the servo driver or the like, a response of the load device according to the control parameter is measured, and suitability of the control parameter is determined.

In addition, instead of adjusting the parameter while driving the actual load device as mentioned above, the adjustment method can be exemplified by a method of determining a control parameter based on a simulation result relating to the response of the load device. For example, as shown in Patent Document 1, physical models of a servo driver and a load device are used, a control parameter is set and a simulation is repeatedly performed. Then, the control parameter to be finally set is determined based on a response result obtained as the simulation result.

PRIOR-ART DOCUMENTS

Patent Documents

Patent Document 1: Japanese Laid-open No. 2009-122779

Patent Document 2: Japanese Laid-open No. 2006-340480

SUMMARY

Problems to be Solved by the Invention

In determining a control parameter for driving a motor in a motor control device, in the case of actually driving a control object including a motor or a load device or the like and measuring its response as conventionally, the driving of the motor and the measurement of the response must be executed every time the control parameter is to be set, and it will take time to determine the control parameter. Further, in the case where the control parameter set at the time of adjustment is improper due to the driving of the actual control object, there is also a risk that the control object may perform an unexpected operation and be damaged.

On the other hand, even if a physical model is used to perform simulation as conventionally at the time of adjusting the control parameter, since the result of the simulation is constrained by the shape or order of the physical model, when there is a difference in the shape of the assumed physical model and characteristics of the actual control object, simulation accuracy may be reduced. In other words, in order to improve the simulation accuracy, it is necessary to reconcile the physical model with the characteristics of the actual control object, and an excessive burden with respect to the adjustment of the control parameter will be placed on a user.

The present invention has been made in view of such problems, and aims to provide a technique for improving the accuracy of simulation of a control system, the control system having a control object including a motor and a motor control device controlling the motor.

Means for Solving the Problems

In the present invention, in order to solve the above-mentioned problems, a part of a simulation operation is configured to include processing that utilizes impulse response information relating to a predetermined device-side configuration including a control object to calculate a time response of the predetermined device-side configuration. According to such a configuration, it is possible to realize highly accurate simulation according to characteristics of the actual control object.

In details, the present invention is a simulation device simulating a control system, the control system having a control object including a motor and a motor control device controlling the motor, wherein the simulation device includes: a simulation system, including a predetermined feedback system having, as a forward element, at least a predetermined control block structure corresponding to a predetermined device-side configuration including the control object; a holding unit, holding impulse response information for calculation which is information on an impulse response relating to the predetermined device-side configuration; a first response calculation unit, calculating a time response of the predetermined device-side configuration to a predetermined input value by convolution processing using the impulse response information for calculation and the predetermined input value; and a second response calculation unit, calculating a response of the simulation system to a command value input to the simulation system by using the time response of the predetermined device-side configuration calculated by the first response calculation unit.

The simulation device of the present invention includes the simulation system including the predetermined feedback system using at least the control block structure corresponding to the predetermined device-side configuration as the forward element, wherein calculation processing by a first response calculation unit and a second response calculation unit is performed on the premise of the simulation system. With respect to the predetermined device-side configuration, its impulse response information is held as the impulse response information for calculation by the holding unit. Then, the first response calculation unit calculates the time response to the predetermined input value to the predetermined device-side configuration by the convolution processing using the impulse response information for calculation. By utilizing the impulse response information for calculation in this way, the user no longer needs to construct a physical model corresponding to the predetermined device-side configuration for simulation, and it is possible to suitably reflect the actual characteristics of the predetermined device-side configuration including the control object and to accurately calculate the time response thereof.

Here, the impulse response information for calculation held by the holding unit is limited due to reasons such as the capacity required for the holding and so on. Hence, a steady-state deviation may remain in the time response calculated by the first response calculation unit, and the simulation accuracy may be affected as a result. However, in the simulation device of the present invention, considering a feedback loop included in the simulation system, response calculation processing by the second response calculation unit is performed which uses the time response of the predetermined device-side configuration calculated by the first response calculation unit. For example, the second response calculation unit may, in the predetermined feedback system, calculate the response of the simulation system in accordance with a method of feeding back the time response of the predetermined device-side configuration or a predetermined response result calculated from the time response to an input side of the forward element. Accordingly, the steady-state deviation arising from the impulse response information can be reduced, and simulation accuracy can be improved. In addition, the above-mentioned simulation system can also include other control block structures corresponding to nonlinear compensation or feed forward compensation and so on.

Here, a specific configuration of the simulation system in the above-mentioned simulation device is exemplified below. First of all, the impulse response may be the impulse response to a current command, and the predetermined feedback system may be a speed feedback system, and may be configured to include, as the forward element in the predetermined feedback system, the predetermined control block structure and a speed control block structure relating to speed compensation. In this case, the second response calculation unit calculates the time response of the simulation system so that a speed response calculated by the first response calculation unit is fed back to the speed control block structure in accordance with the feedback method. Alternatively, the impulse response may be the impulse response to a speed command, and the predetermined feedback system may be a position feedback system, and may be configured to include, as the forward element in the predetermined feedback system, the predetermined control block structure and a position control block structure relating to position compensation. In this case, the second response calculation unit calculates the time response of the simulation system so that a position response based on the speed response calculated by the first response calculation unit is fed back to the position control block structure in accordance with the feedback method. That is, the simulation device of the present invention can be suitably applied to the simulation system including the predetermined feedback system using the predetermined control block structure corresponding to a device-side impulse response as the forward element, wherein the simulation system may include a control block structure or a feedback system other than the predetermined control block structure and the predetermined feedback system, and a feed forward system.

Here, in the simulation device so far described, the holding unit may hold a plurality of patterns of impulse response information as the impulse response information for calculation; then, based on a driving state of the control object, the first response calculation unit may select predetermined impulse response information from among the plurality of patterns of impulse response information owned by the holding unit, and execute the convolution processing using the selected predetermined impulse response information and the predetermined input value. Since the predetermined device-side configuration includes the control object, the impulse response relating to the predetermined device-side configuration may vary as the driving state of the control object changes. For example, in the cases where the control object is in a first driving state and where it is in a second driving state, since mechanical load or mechanical rigidity or the like of the control object varies, the impulse response relating to the predetermined device-side configuration including the control object will vary. Therefore, by selecting the impulse response (predetermined impulse response) according to the driving state of the control object as mentioned above and subjecting it to the convolution processing by the first response calculation unit, it is possible to realize a suitable simulation according to the driving state of the control object.

In more detail, the plurality of patterns of impulse response information are respectively associated with a plurality of reference driving states which are different driving states of the control object; moreover, the first response calculation unit may select the predetermined impulse response information based on a correlation between the driving state of the control object and each of the plurality of reference driving states. That is, even if the current driving state of the control object is different from the reference driving state corresponding to the held impulse response information for calculation, by selecting the impulse response information associated with any reference driving state based on a correlation between the current driving state and a proximity degree of the reference driving state, the simulation accuracy can be reasonably improved.

In addition, although in the above-mentioned simulation device, the selection of the predetermined impulse response is performed using the correlation between the driving state of the control object and the reference driving state, as one aspect thereof, a case is mentioned where the control object includes a driving object machine driven by a plurality of motors. In such a case, a state amount of the driving object machine, for example, a state amount of a predetermined portion of the driving object machine, is not necessarily uniquely associated with a state amount of the motors. That is, even if the state amount differs between each motor, there are cases where the state amount of the predetermined portion of the driving object machine may be the same. In such a case, instead of associating the state amount of the motors as the reference driving state with the impulse response information, it is preferable to associate the state amount of the predetermined portion of the driving object machine as the reference driving state with the impulse response information. In detail, in the above-mentioned simulation device, in the case where the control object includes the driving object machine driven by a plurality of the motors, the plurality of patterns of impulse response information are respectively associated with the plurality of reference driving states relating to the state amount of the predetermined portion of the driving object machine; then, the first response calculation unit may select the predetermined impulse response information based on a correlation between the state amount of the predetermined portion of the driving object machine and each of the plurality of reference driving states. According to such a configuration, even if the driving object machine is driven and controlled by a plurality of motors, it is possible to easily select a suitable predetermined impulse response by simulation. The state amount of the predetermined portion of the driving object machine can be exemplified by a parameter such as position or temperature or the like of the portion.

Here, in the simulation device so far described, the holding unit may hold the plurality of patterns of impulse response information as the impulse response information for calculation, and in that case, the first response calculation unit may select at least two pieces of impulse response information from among the plurality of patterns of impulse response information owned by the holding unit based on the driving state of the control object, synthesize new impulse response information according to the driving state of the control object from the selected at least two pieces of impulse response information, and execute the convolution processing by using the synthesized new impulse response information and the predetermined input value. By synthesizing the new impulse response information and subjecting it to the convolution processing in this way, even in a driving state that had no corresponding impulse response information, a suitable simulation result can be obtained.

Here, in the simulation device so far described, the holding unit may hold, as the impulse response information for calculation, the plurality of patterns of impulse response information associated with the plurality of reference driving states which are different driving states of the control object, and hold frequency characteristic information associated with each of the plurality of patterns of impulse response information and the plurality of pieces of reference driving information and capable of generating the various impulse response information. In that case, the simulation device may further include an impulse response information generation unit which, based on a correlation between the driving state of the control object and each of at least two of the plurality of reference driving states, generates, from the frequency characteristic information associated with the at least two reference driving states, new frequency characteristic information corresponding to the driving state of the control object, and, based on the generated new frequency characteristic information, generates new impulse response information corresponding to the driving state of the control object. Then, the first response calculation unit may execute the convolution processing by using the new impulse response information generated by the impulse response information generation unit and the predetermined input value.

According to such a configuration, in the simulation device, even if the driving state of the control object is different from the existing reference driving state associated with the impulse response information held by the holding unit, it is possible to generate a frequency characteristic according to the driving state from the frequency characteristic information corresponding to the existing reference driving state, and based on that, generate the impulse response information according to the driving state. Accordingly, even if the impulse response information is not prepared comprehensively with respect to the predetermined device-side configuration as the impulse response information for calculation, it is possible to obtain a suitable simulation result, and the user's burden relating to preparation for simulation can be reduced.

In addition, with respect to the generation of the new frequency characteristic by the impulse response information generation unit, the generation may be performed by weighted averaging the frequency characteristic information corresponding to the existing reference driving state. That is, in the above-mentioned simulation device, the impulse response information generation unit may, based on the correlation between the driving state of the control object and each of the at least two reference driving states, generate the new frequency characteristic information by weighted averaging the frequency characteristic information associated with the at least two reference driving states. Moreover, the weighted averaging is only one aspect for generating the new frequency characteristic information, and other processing may also be performed to generate the new frequency characteristic information.

Here, in the simulation device so far described, there may be further included the impulse response information generation unit selecting at least two pieces of impulse response information from among the plurality of patterns of impulse response information owned by the holding unit and generating the new impulse response information from the selected at least two pieces of impulse response information; in that case, the holding unit may hold the new impulse response information generated by the impulse response information generation unit. According to such a configuration, in generating the new impulse response information, information (for example, frequency characteristic information, etc.) as a basis for the generation is not required. As a result, it is possible to obtain a suitable simulation result while suppressing the user's burden relating to preparation for simulation. In addition, with respect to the generation of the new impulse response information, the impulse response information generation unit may perform the generation by weighted averaging the at least two pieces of impulse response information.

In addition, the present invention may be obtained from an aspect of a simulation method simulating a control system, the control system having a control object including a motor and a motor control device controlling the motor. In this case, the method includes: a step of calculating a time response of a predetermined device-side configuration including the control object to a predetermined input value, by convolution processing using impulse response information for calculation which is information on an impulse response relating to the predetermined device-side configuration and the predetermined input value; and a step of, based on a simulation system including a predetermined feedback system having as a forward element at least a predetermined control block structure corresponding to the predetermined device-side configuration, calculating a response of the simulation system to a command value input to the simulation system by using the time response of the predetermined device-side configuration calculated in the calculation step by the convolution processing. Moreover, it is possible to apply a technical idea disclosed in relation to the invention of the above-mentioned simulation device to the invention of the simulation method, as long as there is no technical inconsistency.

In addition, the present invention can also be grasped from an aspect of a simulation program which causes a simulation device to execute processing including the following steps, wherein the simulation device simulates a control system, and the control system has a control object including a motor and a motor control device controlling the motor. The simulation program causes the simulation device to execute: a step of calculating a time response of a predetermined device-side configuration including the control object to a predetermined input value, by convolution processing using impulse response information for calculation which is information on an impulse response relating to the predetermined device-side configuration and the predetermined input value; and a step of, based on a simulation system including a predetermined feedback system having as a forward element at least a predetermined control block structure corresponding to the predetermined device-side configuration, calculating a response of the simulation system to a command value input to the simulation system by using the time response of the predetermined device-side configuration calculated in the calculation step by the convolution processing. Moreover, it is possible to apply a technical idea disclosed in relation to the invention of the above-mentioned simulation device to the invention of the simulation program, as long as there is no technical inconsistency.

Effects of the Invention

The simulation accuracy of the control system having the control object including the motor and the motor control device controlling the motor is improved.

DESCRIPTION OF THE EMBODIMENTS

Example 1

Figure 1:
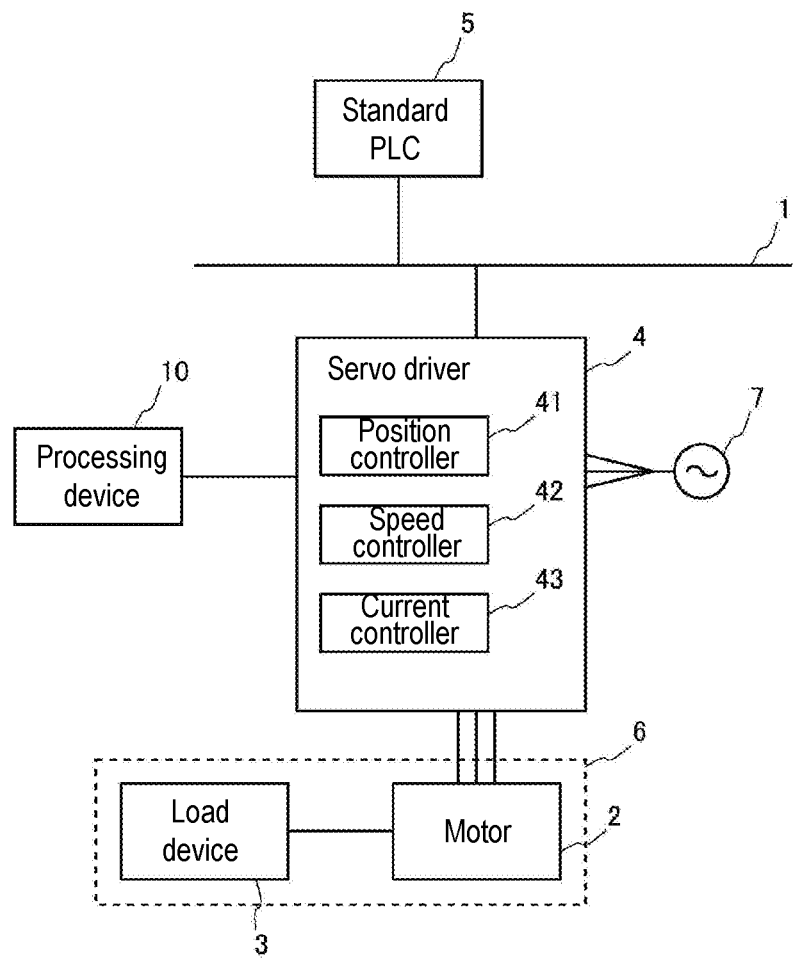
FIG. 1 is a diagram showing a schematic configuration of a control system to be subjected to a simulation processing by a simulation device according to the present invention.

FIG. 1 is a schematic configuration diagram of a control system to be subjected to simulation processing by a simulation device according to an embodiment of the present invention. The control system includes a network 1, a motor 2, a load device 3, a servo driver 4, and a standard programmable logic controller (PLC) 5. The control system is a system for driving and controlling the load device 3 together with the motor 2. The motor 2 and the load device 3 are taken as a control object 6 controlled by the control system. Here, the load device 3 can be exemplified by various mechanical devices (for example, an arm of an industrial robot or a conveyance device), and the motor 2 is incorporated in the load device 3 as an actuator that drives the load device 3. For example, the motor 2 is an AC servomotor. An encoder (not shown) is attached to the motor 2, and a parameter signal relating to a motion of the motor 2 is transmitted as feedback to the servo driver 4 by the encoder. The parameter signal (hereinafter referred to as feedback signal) transmitted as feedback includes, for example, positional information on a rotation position (angle) of a rotary shaft of the motor 2, information on a rotational speed of the rotary shaft, and so on.

The servo driver 4 receives a motion command signal relating to the motion of the motor 2 from the standard PLC 5 via the network 1, and receives a feedback signal output from the encoder connected to the motor 2. Based on the motion command signal from the standard PLC 5 and the feedback signal from the encoder, the servo driver 4 calculates a servo control relating to driving of the motor 2, that is, a command value relating to the motion of the motor 2, and supplies a driving current to the motor 2 so that the motion of the motor 2 follows the command value. As the supplied current, AC power sent from an AC power supply 7 to the servo driver 4 is utilized. In the present embodiment, the servo driver 4 is of a type that receives three-phase alternating current, but may also be of a type that receives single-phase alternating current. Moreover, the servo control by the servo driver 4 is feedback control utilizing a position controller 41, a speed controller 42 and a current controller 43 included in the servo driver 4, and the details thereof are described later based on FIG. 2.

Figure 2:
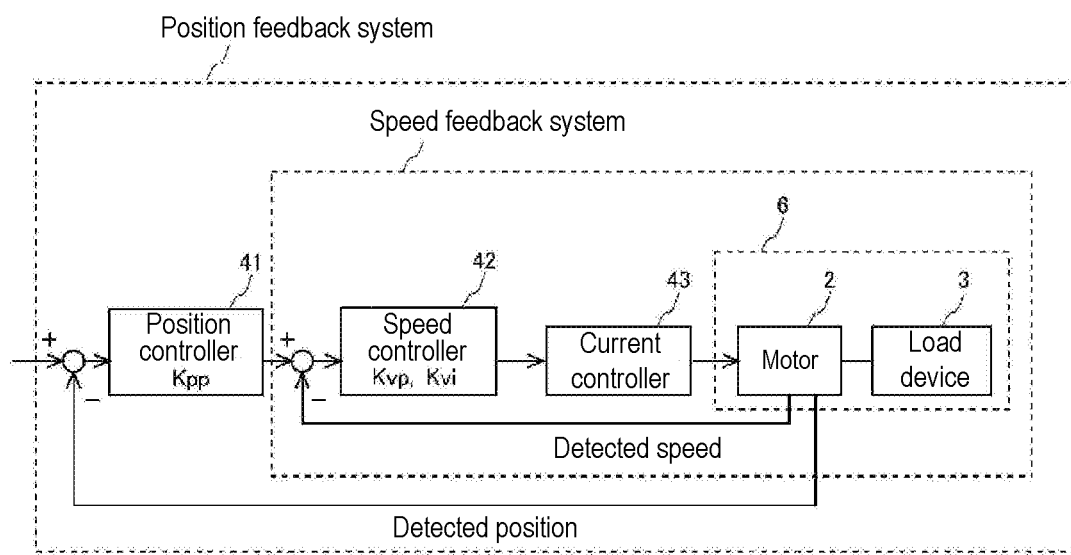
FIG. 2 is a diagram showing a control structure of a servo driver included in the control system shown in FIG. 1.

Here, as shown in FIG. 1, the servo driver 4 includes the position controller 41, the speed controller 42 and the current controller 43, and the above-mentioned servo control is executed by these processing. Therefore, based on a control structure of the servo driver 4 shown in FIG. 2, the content of the above-mentioned servo control by the servo driver 4 is explained. As shown in FIG. 2, the position controller 41 performs, for example, proportional control (P control). Specifically, by multiplying a positional deviation which is a deviation between a position command notified from the standard PLC 5 and a detected position by position proportional gain Kpp, a speed command is calculated. The position controller 41 has the position proportional gain Kpp as a control parameter in advance.

Next, the speed controller 42 performs, for example, proportional integral control (PI control). Specifically, by multiplying an integral amount of a speed deviation which is a deviation between the speed command calculated by the position controller 41 and a detected speed by speed integral gain Kvi, and multiplying a sum of the calculation result and the speed deviation by speed proportional gain Kvp, a torque command is calculated. The speed controller 42 has the speed integral gain Kvi and the speed proportional gain Kvp as control parameters in advance. In addition, the speed controller 42 may perform P control instead of PI control. In this case, the speed controller 42 has the speed proportional gain Kvp as a control parameter in advance. Next, the current controller 43 outputs a current command based on the torque command calculated by the speed controller 42, whereby the motor 2 is driven and controlled. The current controller 43 includes a filter (first order low-pass filter) or one or more notch filters relating to the torque command, and has, as control parameters, cut-off frequencies or the like relating to the performance of these filters.

The control structure of the servo driver 4 includes a speed feedback system using the speed controller 42, the current controller 43 and the control object 6 as forward elements, and further includes a position feedback system using the speed feedback system and the position controller 41 as forward elements. By the control structure configured in this way, it is possible for the servo driver 4 to servo-control the motor 2 so as to follow the position command supplied from the standard PLC 5.

Here, referring back to FIG. 1, a processing device 10 is electrically connected to the servo driver 4. The electrical connection may be wired connection or wireless connection. The processing device 10 is a device for setting and adjusting the above-mentioned control parameters of the servo driver 4, and is equipped with adjustment software (program). Specifically, the processing device 10 is a computer having an arithmetic device or a memory and so on, and the executable adjustment software is installed thereon. The processing device 10 uses this adjustment software to adjust the above-mentioned control parameters (the position proportional gain Kpp, the speed proportional gain Kvp, the cut-off frequencies of each filter, etc.) so that a response state of the control object 6 to be controlled by the servo driver 4 becomes optimal. The processing device 10 may be connected to the standard PLC 5. In this case, the processing device 10 accesses the servo driver 4 via the standard PLC 5 and sets and adjusts the control parameters of the servo driver 4.

Moreover, the processing device 10 has a function of simulating a response of a control object by the servo driver 4 by the adjustment software. By this simulation function, the processing device 10 is capable of calculating the response of the control object when a predetermined control parameter is set in the servo driver 4. Then, based on a simulation result by the processing device 10, a user can determine the control parameter to be set in the servo driver 4, and the determined control parameter will be transmitted from the processing device 10 to the servo driver 4 and be held in the position controller 41, the speed controller 42 and the current controller 43 included in the servo driver 4.

In the present embodiment, as mentioned above, a simulation is executed by the processing device 10 in order to determine the control parameter to be set by the servo driver 4 to drive and control the control object 6. However, instead of this aspect, the simulation may also be performed simply in order to grasp a response to the driving and control of the control object 6 by the servo driver 4. In this case, there is no need for the processing device 10 to be electrically connected to the servo driver 4.

Figure 3:
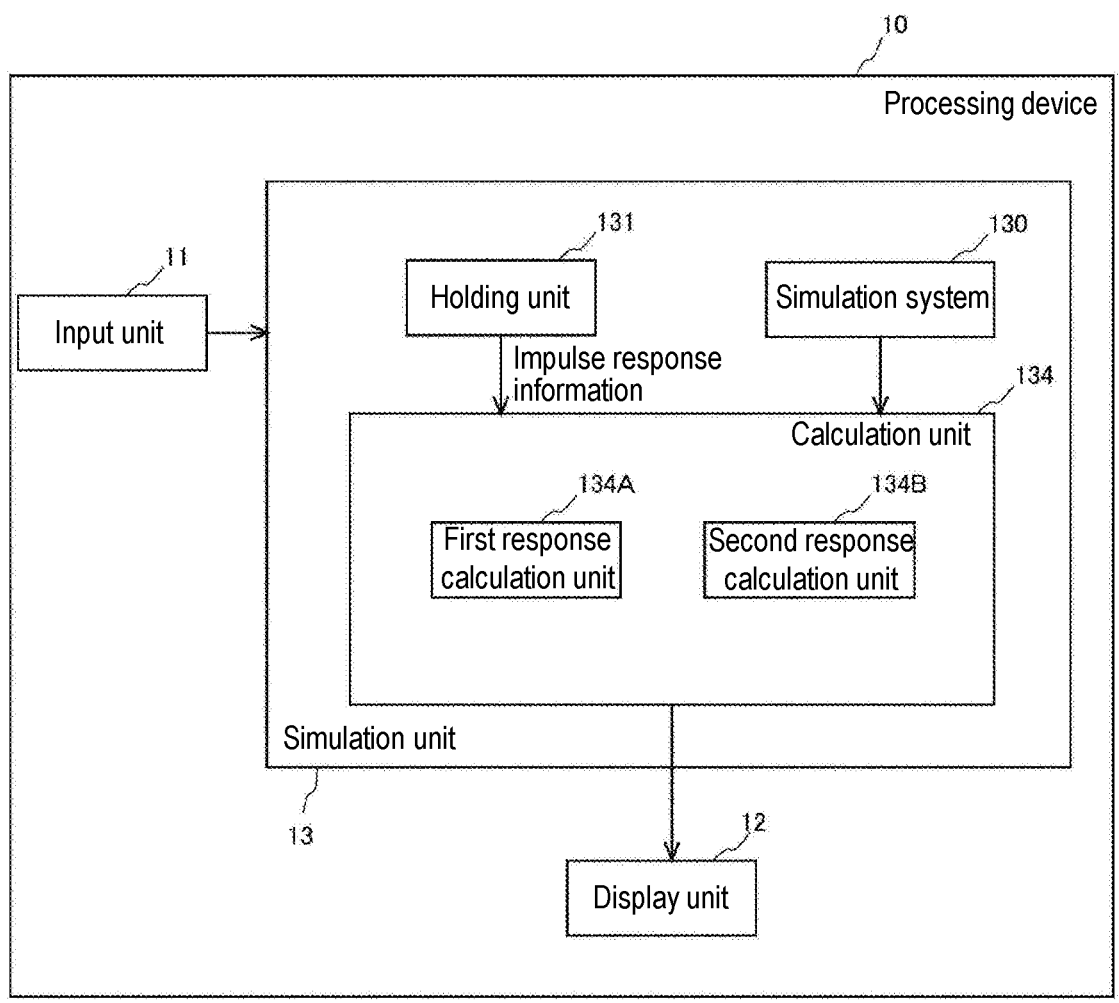
FIG. 3 is a first functional block diagram of a simulation device according to the present invention.

Next, a configuration of the processing device 10 is explained based on FIG. 3. FIG. 3 is a functional block diagram as an image of various functions executed by the above-mentioned adjustment software executed in the processing device 10. The processing device 10 has an input unit 11, a display unit 12, and a simulation unit 13. Among the various functions included in the processing device 10, the input unit 11 is a functional unit receiving an input of information (a command value to be input for simulation, a command for executing a simulation, etc.) for an operation performed by the later-described simulation unit 13. Specifically, the input unit 11 may be composed of a keyboard or a mouse, and may also, together with the later-described display unit 12, be composed of a touch panel which is common hardware. Next, the display unit 12 is a functional unit displaying a simulation result calculated by the simulation unit 13. The display unit 12 is not an essential component of the processing device 10, and may be provided outside the processing device 10. In addition, as mentioned above, the display unit 12 may be configured as a touch panel including the function of the input unit 11.

The simulation unit 13 is a functional unit calculating a response of the control object 6 when the control object 6 is servo-controlled by the servo driver 4. The simulation result which is a calculation result by the simulation unit 13 is displayed on the above-mentioned display unit 12. The simulation unit 13 has a simulation system 130, a holding unit 131, and a calculation unit 134.

Figure 4:
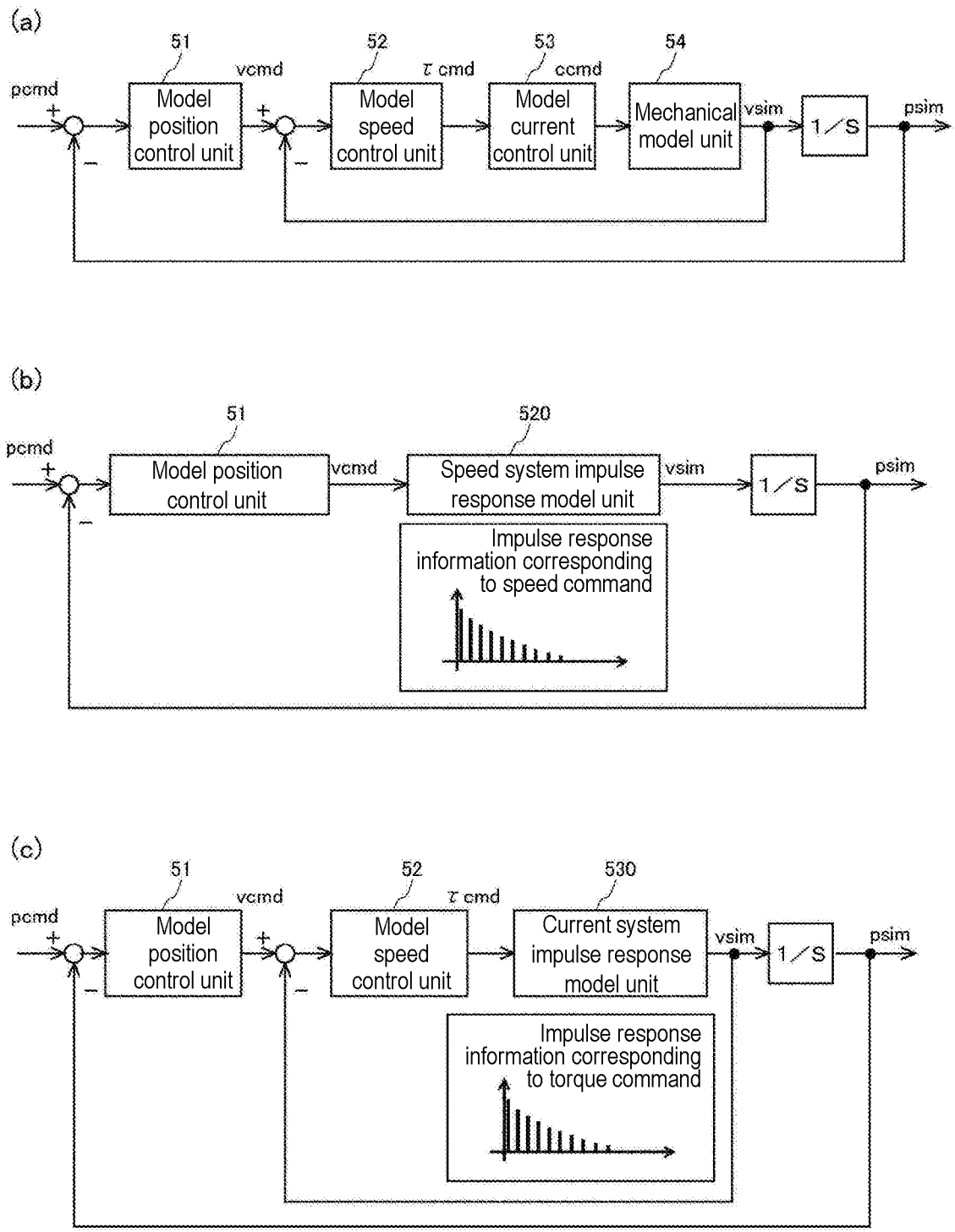
FIG. 4 is a control block diagram showing a structure of a simulation system included in a simulation device according to the present invention, wherein part (b) shows a structure of a simulation system using an impulse response model corresponding to a speed command, and part (c) shows a structure of a simulation system using an impulse response model corresponding to a torque command. Also, part (a) is a diagram showing a basic structure for explaining the simulation system.

First of all, the simulation system 130 is explained based on FIG. 4. The simulation system 130 is a system including a model structure relating to the control object 6 which is to be simulated. The part (a) in the upper part of FIG. 4 shows a basic structure (hereinafter simply referred to as "basic structure") for explaining the simulation system corresponding to a mechanical configuration of the control system shown in FIG. 1. In addition, the part (b) in the middle part of FIG. 4 shows one form of the simulation system 130, and the part (c) in the lower part shows other form of the simulation system 130. The part (b) in the middle part and the part (c) in the lower part of FIG. 4 show the structure of the simulation system 130 adopted by the processing device 10.

The basic structure shown in the part (a) in the upper part of FIG. 4 corresponds to the mechanical configuration of the control system shown in FIG. 1 and includes a model position control unit 51, a model speed control unit 52, a model current control unit 53, and a mechanical model unit 54. The model position control unit 51 corresponds to the position controller 41 of the servo driver 4, the model speed control unit 52 corresponds to the speed controller 42 of the servo driver 4, the model current control unit 53 corresponds to the current controller 43 of the servo driver 4, and the mechanical model unit 54 corresponds to the control object 6. In the basic structure shown in the part (a) of FIG. 4, similarly to the servo driver 4, a positional deviation between a position command pcmd and a response position psim which is a system output is input to the model position control unit 51, and a speed command vcmd is output. Then, a speed deviation between the speed command vcmd and a response speed vsim which is an output of the mechanical model unit 54 is input to the model speed control unit 52, and a torque command Tcmd is output. Then, the torque command Tcmd is input to the model current control unit 53, and a current command ccmd is output. Then, the current command ccmd is input to the mechanical model unit 54, and the above-mentioned response speed vsim, and the above-mentioned response position psim which is an integration result of the response speed vsim, are output.

Here, a control structure shown in the part (b) of FIG. 4, which is one form of the simulation system, is a structure in which the model speed control unit 52, the model current control unit 53 and the mechanical model unit 54 in the basic structure shown in the part (a) of FIG. 4 are replaced with a speed system impulse response model unit 520 which is a predetermined control block structure, and a feedback system using the model position control unit 51 and the speed system impulse response model unit 520 as forward elements is included. When the speed controller 42, the current controller 43 and the control object 6 which are a control system-side mechanical configuration corresponding to the model speed control unit 52, the model current control unit 53 and the mechanical model unit 54 are regarded as one mechanical configuration, the speed system impulse response model unit 520 has, as an impulse response model, information relating to a response (impulse response) at the time when an impulse signal of the speed command is input to the one mechanical configuration. That is, it can be said that the impulse response information owned by the speed system impulse response model unit 520 is speed impulse response-related information that reflects characteristics of the speed controller 42, the current controller 43 and the control object 6 which are the actual control system-side mechanical configuration. Generation of the impulse response information can be realized by the prior art. Generally, it is realized by performing an inverse Fourier transform on a frequency transfer function of a speed closed loop in the control structure shown in the part (b) of FIG. 4. An output with respect to an arbitrary input to the speed system impulse response model unit 520 can be calculated by convolution processing of the arbitrary input and the impulse response information owned by the speed system impulse response model unit 520.

In the case where the simulation system 130 has the control structure shown in the part (b) of FIG. 4, the positional deviation between the position command pcmd and the response position psim which is the system output is input to the model position control unit 51, and the speed command vcmd is calculated. Then, when the speed command vcmd is input to the speed system impulse response model unit 520, the response speed vsim corresponding to the speed command vcmd is calculated by convolution processing, and the above-mentioned response position psim which is the integration result of the response speed vsim is further calculated. The calculations of each control value in the simulation system 130 are performed by a first response calculation unit 134A and a second response calculation unit 134B included in the calculation unit 134, and the details thereof are described later.

Next, a control structure shown in the part (c) of FIG. 4, which is other form of the simulation system, is a structure in which the model current control unit 53 and the mechanical model unit 54 in the basic structure shown in the part (a) of FIG. 4 are replaced with a current system impulse response model unit 530 which is a predetermined control block structure, and a speed feedback system using the model speed control unit 52 and the current system impulse response model unit 530 as forward elements as well as a position feedback system using the model position control unit 51 and the speed feedback system as forward elements are included. When the current controller 43 and the control object 6 which are the control system-side mechanical configuration corresponding to the model current control unit 53 and the mechanical model unit 54 are regarded as one mechanical configuration, the current system impulse response model unit 530 has, as an impulse response model, information relating to a speed response (speed impulse response) at the time when an impulse signal of the torque command is input to the one mechanical configuration. Generation of the impulse response information can be realized by the prior art. Generally, it is realized by performing an inverse Fourier transform on a frequency transfer function relating to the model current control unit 53 and the mechanical model unit 54 in the control structure shown in the part (c) of FIG. 4. An output with respect to an arbitrary input to the current system impulse response model unit 530 can be calculated by convolution processing of the arbitrary input and the impulse response information owned by the current system impulse response model unit 530.

In the case where the simulation system 130 has the control structure shown in the part (c) of FIG. 4, the positional deviation between the position command pcmd and the response position psim which is the system output is input to the model position control unit 51, and the speed command vcmd is calculated. Then, the speed deviation between the speed command vcmd and the response speed vsim is input to the model speed control unit 52, and the torque command Tcmd is calculated. Then, when the torque command Tcmd is input to the current system impulse response model unit 530, the response speed vsim corresponding to the torque command Tcmd is calculated by convolution processing, and the above-mentioned response position psim which is the integration result of the response speed vsim is further calculated. The calculations of each control value in the simulation system 130 are also performed by the first response calculation unit 134A and the second response calculation unit 134B included in the calculation unit 134, and the details thereof are described later.

In this way, the simulation system 130 has an impulse response model unit as a control block corresponding to a mechanical configuration including at least the control object 6 which is to be simulated, and has a feedback system using at least the impulse response model unit as a forward element. In addition, the holding unit 131 is a functional unit holding the impulse response information included in the impulse response model unit included in the simulation system 130. In addition, the calculation unit 134 is a functional unit receiving the impulse response information held by the holding unit 131, and performing simulation processing in accordance with the simulation system 130, that is, calculation of the response speed vsim and the response position psim which are response results of the simulation system 130. The calculation unit 134 has the first response calculation unit 134A and the second response calculation unit 134B as sub functional units. The first response calculation unit 134A is a sub functional unit calculating the response speed vsim relating to the convolution processing utilizing the impulse response information owned by the speed system impulse response model unit 520 of the part (b) of FIG. 4, or a sub functional unit calculating the response speed vsim relating to the convolution processing utilizing the impulse response information owned by the current system impulse response model unit 530 of the part (c) of FIG. 4. In addition, the second response calculation unit 134B is a sub functional unit calculating a time response to a command value input to the simulation system 130, that is, the response position psim, by using a calculation result of the first response calculation unit 134A, that is, the response speed vsim calculated by convolution processing.

Here, a flow of calculation processing by the calculation unit 134 for calculating the time response psim of the position and the time response vsim of the speed when a predetermined position command for simulation processing is input to a simulation system is schematically shown in: (1)

a case where the simulation system 130 is the control structure shown in the part (b) of FIG. 4, and (2) a case where the simulation system 130 is the control structure shown in the part (c) of FIG. 4.

(1) Case where the Simulation System 130 is the Control Structure Shown in the Part (b) of FIG. 4.

Figure 5A:
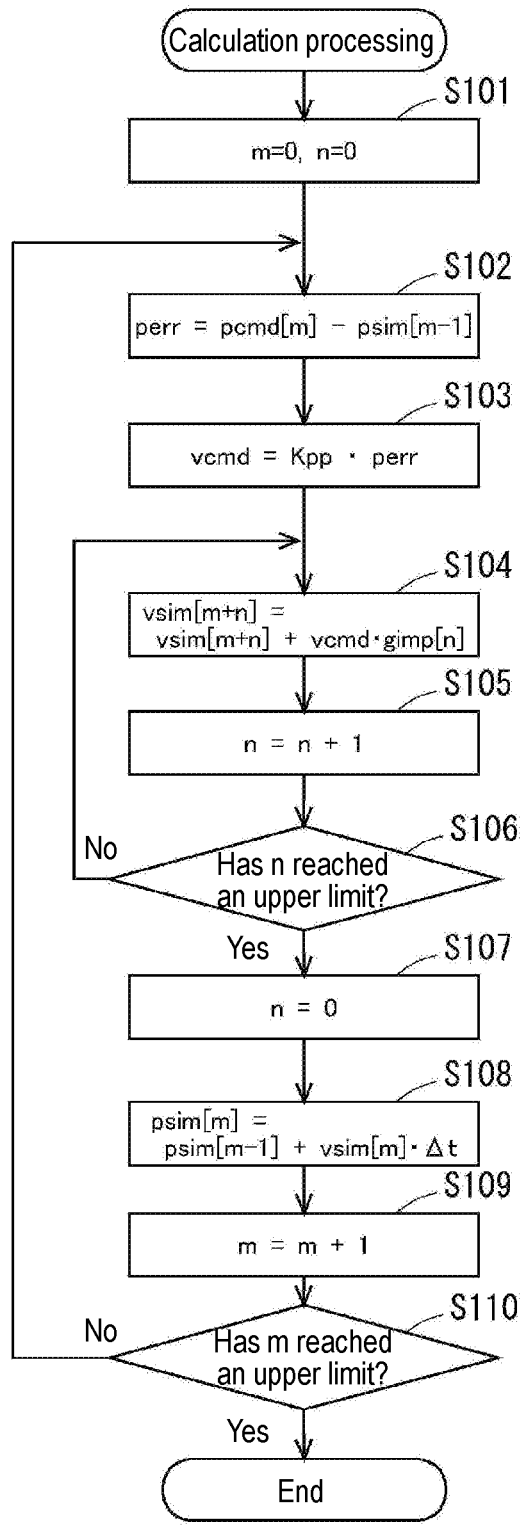
FIG. 5A is a first flowchart for calculation processing in a simulation device according to the present invention.

The flow of the calculation processing in this case is explained in accordance with a flowchart shown in FIG. 5A. Moreover, the calculation processing is executed in the case where a command value for simulation processing is received by the input unit 11. First of all, in S101, a parameter m and a parameter n are initialized. Next, in S102, a positional deviation pen which is the deviation between the position command pcmd and the response position psim is calculated. After that, in S103, by multiplying the positional deviation pen by the position proportional gain Kpp, the speed command vcmd is calculated.

Next, in S104 to S106, the speed command vcmd is used as an input to the speed system impulse response model unit 520, and convolution processing for calculating the response speed vsim which is an output from the speed system impulse response model unit 520 is performed. Specifically, in S104, an operation in accordance with the following Equation 1 is performed; next, in S105, the parameter n is incremented.

$$vsim[m+n]=vsim[m+n]+vcmd\cdot gimp[n] \quad \text{(Equation 1)}$$

However, gimp[n] is the impulse response information owned by the speed system impulse response model unit 520. This information means a speed response to an impulse-like speed input.

Then, in S106, it is determined whether or not the parameter n has reached an upper limit, that is, whether or not an upper limit repetition number for repeating the operation by Equation 1 according to length of the impulse response information gimp has been reached. If a negative determination is made in S106, the processing in and after S104 is repeated; if a positive determination is made, the processing proceeds to S107.

Then, in S107, the parameter n is initialized again. Next, in S108, an operation in accordance with the following Equation 2 is performed.

$$psim[m]=psim[m-1]+vsim[m]\cdot \Delta t \quad \text{(Equation 2)}$$

That is, in S108, the response speed vsim calculated by the convolution processing is integrated, and the response position psim is calculated. After that, in S109, the parameter m is incremented. Then, in S110, it is determined whether or not the parameter m has reached an upper limit, that is, whether or not an upper limit repetition number for repeating the processing from S102 to S109 according to time (desired response time) for which simulation is intended to be performed by the calculation processing has been reached. If a negative determination is made in S110, the processing in and after S102 is repeated; if a positive determination is made, the present calculation processing is ended.

(2) Case where the Simulation System 130 is the Control Structure Shown in the Part (c) of FIG. 4.

Figure 5B:
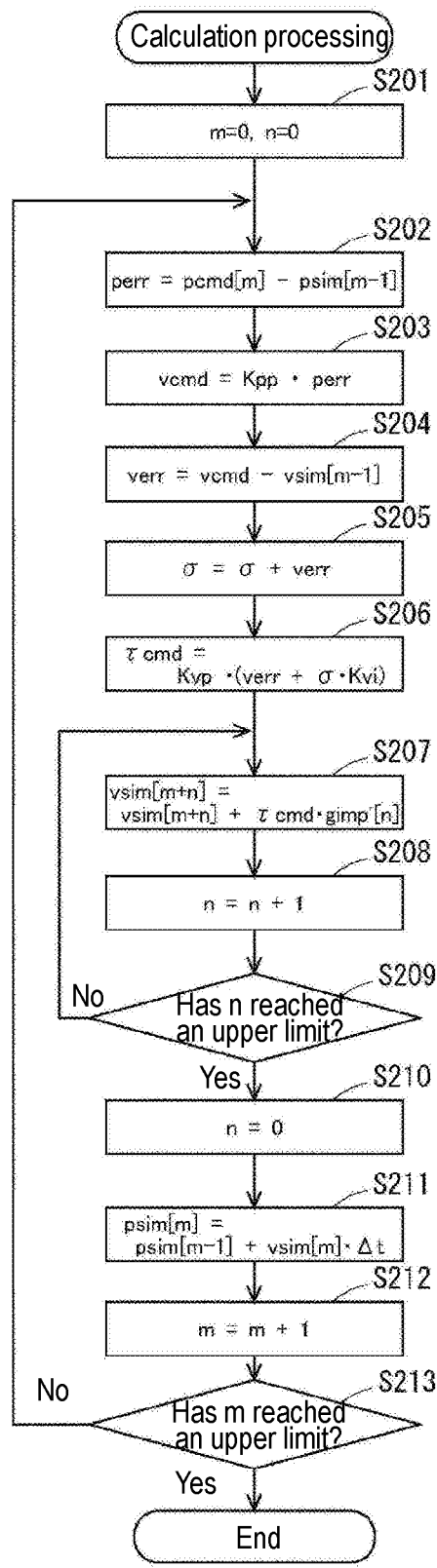
FIG. 5B is a second flowchart for calculation processing in a simulation device according to the present invention.

The flow of the calculation processing in this case is explained in accordance with a flowchart shown in FIG. 5B. Moreover, the calculation processing is executed in the case where an input value for simulation processing is received by the input unit 11. First of all, in S201, the parameter m and the parameter n are initialized. Next, in S202, the positional deviation perr which is the deviation between the position command pcmd and the response position psim is calculated. After that, in S203, by multiplying the positional deviation perr by the position proportional gain Kpp, the speed command vcmd is calculated.

Next, in S204, a speed deviation verr which is the deviation between the speed command vcmd and the response speed vsim is calculated. Further, in S205, the speed deviation verr is integrated and an integral amount σ is calculated; in S206, the torque command Tcmd is calculated in accordance with the following Equation 3.

$$Tcmd=Kvp\cdot(verr+\sigma\cdot Kvi) \quad \text{(Equation 3)}$$

However, Kvp represents the speed proportional gain, and Kvi represents the speed integral gain. Accordingly, in the present calculation processing, PI control is executed.

Next, in S207 to S209, the torque command Tcmd is used as an input to the current system impulse response model unit 530, and convolution processing for calculating the response speed vsim which is an output from the current system impulse response model unit 530 is performed. Specifically, in S207, an operation in accordance with the following Equation 4 is performed; next, in S208, the parameter n is incremented.

$$vsim[m+n]=vsim[m+n]+\tau cmd\cdot gimp'[n] \quad \text{(Equation 4)}$$

However, gimp'[n] is the impulse response information owned by the current system impulse response model unit 530. This information means a speed response to an impulse-like torque input.

Then, in S209, it is determined whether or not the parameter n has reached an upper limit, that is, whether or not an upper limit repetition number for repeating the operation by Equation 4 according to length of the impulse response information gimp' has been reached. If a negative determination is made in S209, the processing in and after S207 is repeated; if a positive determination is made, the processing proceeds to S210.

Then, in S210, the parameter n is initialized again. Next, in S211, an operation in accordance with the following Equation 5 is performed.

$$psim[m]=psim[m-1]+vsim[m]\cdot \Delta t \quad \text{(Equation 5)}$$

That is, in S211, the response speed vsim calculated by the convolution processing is integrated, and the response position psim is calculated. After that, in S212, the parameter m is incremented. Then, in S213, it is determined whether or not the parameter m has reached an upper limit, that is, whether or not an upper limit repetition number for repeating the processing from S202 to S212 according to time (desired response time) for which simulation is intended to be performed by the calculation processing has been reached. If a negative determination is made in S213, the processing in and after S202 is repeated; if a positive determination is made, the present calculation processing is ended.

Figure 6:
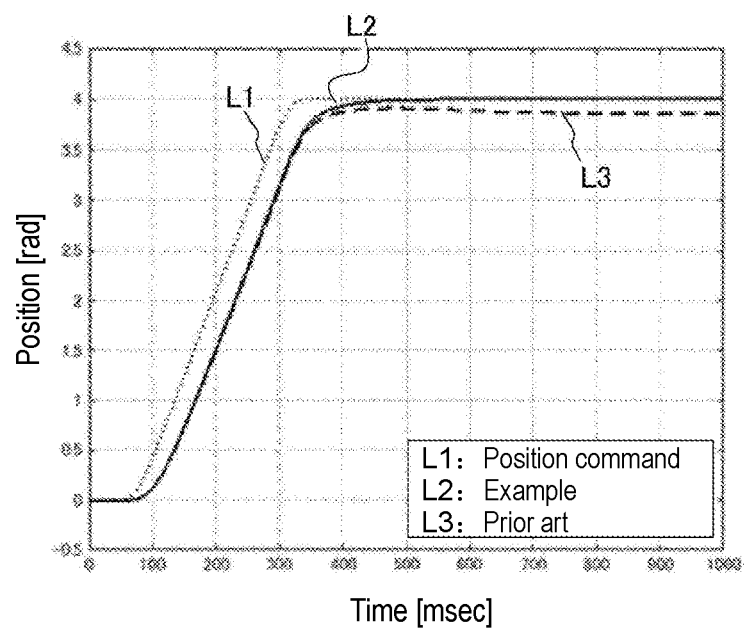
FIG. 6 is a diagram showing a simulation result by the calculation processing shown in FIG. 5B in a simulation device according to the present invention.

Here, FIG. 6 shows a simulation result when the calculation processing shown in FIG. 5B is executed. The horizontal axis in FIG. 6 represents time, and the vertical axis represents the response position psim. Here, line L1 in FIG. 6 represents a transition of the position command pcmd, and line L2 represents a transition of the response position psim by the above-mentioned calculation processing. Also, for comparison, line L3 represents a transition of a position calculated in accordance with the prior art, specifically, in the case represented by an impulse response model unit (hereinafter referred to as "conventional impulse response model unit") corresponding to the entire basic structure including the model position control unit 51, the model speed control unit 52, the model current control unit 53, the machine model unit 54 and the feedback loop shown in the part (a) of FIG. 4, a transition of a position calculated by convolution processing using the position command pcmd input to the conventional impulse response model unit and the impulse response information owned by the conventional impulse response model unit.

In general, a time axis of the impulse response information owned by the impulse response model unit is limited information. Hence, as a result, in the case of using the conventional impulse response model, a response result cannot completely follow the position command, and a steady-state deviation remains, resulting in a decrease in simulation accuracy. In order to reduce the steady-state deviation, the time axis in the impulse response information should be as long as possible; however, in that case, since capacity of the impulse response information may increase, and calculation time for simulation may increase, it is not practical.

On the other hand, according to the calculation processing shown in FIG. 5B, the response result suitably follows the position command, and the steady-state deviation is largely eliminated. The reason is that, as shown in the part (c) of FIG. 4, in calculating the response speed vsim, the convolution processing is performed using the impulse response information owned by the current system impulse response model unit 530 using the torque command Tcmd as an input, and the feedback system using the current system impulse response model unit 530 and the model speed control unit 52 as forward elements is included in the simulation system 130. That is, in the calculation of the response position psim, combined processing of the calculations by the first response calculation unit 134A and the calculation by the second response calculation unit 134B is performed. Accordingly, unlike the case of using the conventional impulse response model unit that calculates the position response using only the impulse response information is used, if according to the calculation processing shown in FIG. 5B, the steady-state deviation at the response position can be effectively eliminated. In addition, in calculating the response position, by utilizing the convolution processing by using the impulse response information, there is no need to set a physical model of the control object for the calculation, and therefore a highly accurate response result more compliant with the actual machine can be obtained.

In addition, according to the calculation processing shown in FIG. 5A, the steady-state deviation at the response position can be effectively eliminated in the same manner.

Example 2

Figure 7:
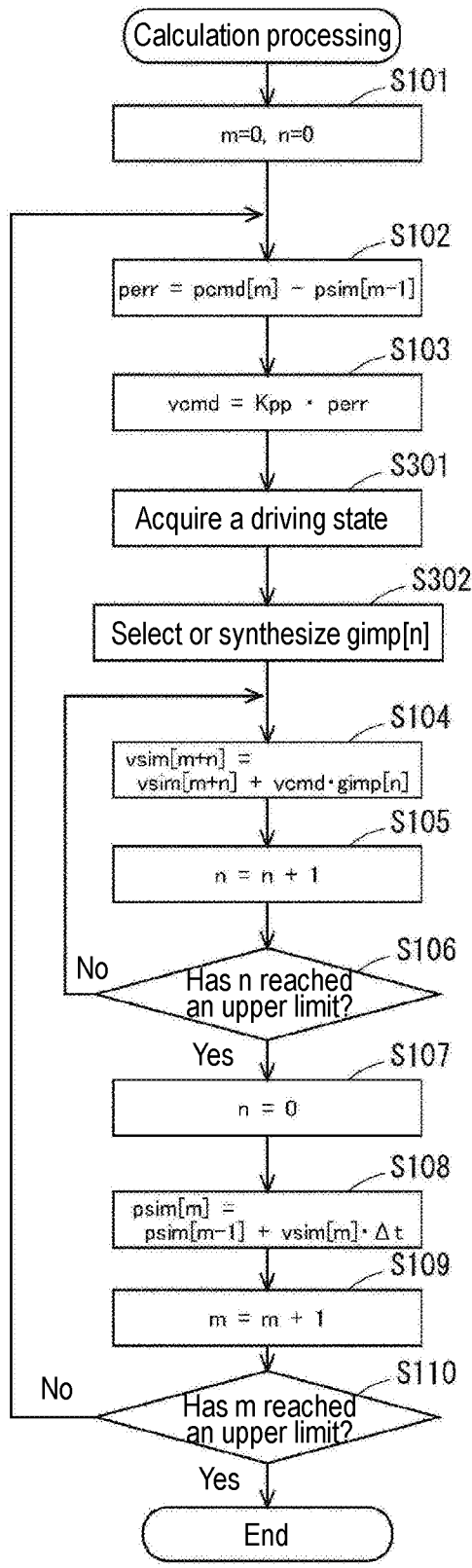
FIG. 7 is a third flowchart for calculation processing in a simulation device according to the present invention.

Next, the third calculation processing to be executed by the processing device 10 is explained based on a flowchart shown in FIG. 7. The calculation processing is also executed by the calculation unit 134 of the simulation unit 13, wherein substantially the same processing as those in the calculation processing shown in FIG. 5A are denoted by the same reference numerals, and the detailed description thereof is omitted. The present embodiment is similarly applicable to the calculation processing shown in FIG. 5B. In the calculation processing shown in FIG. 7, when the processing in S103, that is, the calculation of the speed command vcmd, is performed, the processing in S301 is performed next. In S301, a driving state of the control object 6 is acquired. Here, the driving state of the control object 6 means predetermined parameters related to driving and control in the motor 2 included in the control object 6 and the load device 3. For example, a driving command value (position command, speed command, etc.) for the motor 2, an actual or estimated state amount (position and speed of the motor 2, position, speed and inertia of the load device 3, etc.) of the motor 2 or the load device 3 and so on may be mentioned. That is, a predetermined parameter related to a state formed by driving and controlling the control object 6 is taken as the driving state of the control object 6.

Then, in S302 after S301, based on the driving state of the control object 6, the impulse response information used in the convolution processing performed in S107 to S109, that is, the impulse response information gimp for the speed system impulse response model unit 520 is selected or synthesized. This selection of the impulse response information gimp means to select the impulse response information to be used for convolution processing from among a plurality of pieces of impulse response information owned by the holding unit 131. In addition, the synthesis of the impulse response information gimp means to utilize the plurality of pieces of impulse response information owned by the holding unit 131 to generate new impulse response information to be used for convolution processing. Accordingly, the selected or synthesized impulse response information will be used as the impulse response information gimp for the speed system impulse response model unit 520 in S104 subsequent to S302. The processing in S301 and S302 is performed by the first response calculation unit 134A.

Moreover, in S104 to S106, the convolution processing is performed; after that, when the processing in and after S102 is performed again after a negative determination is made in S110, the impulse response information gimp to be used in the next convolution processing is selected or synthesized again based on the driving state of the control object 6 at that time. Accordingly, in the calculation processing shown in FIG. 7, since the impulse response information gimp that properly reflects the driving state of the control object 6 is used, a time response of a simulation system can be more accurately calculated.

Hereinafter, examples of selecting or synthesizing the impulse response information gimp based on the driving state of the control object 6 are explained.

Example 2-1

In Example 2-1, the load device 3 is set as a conveyance device having a table configured to reciprocate via a ball screw and conveying a predetermined load in one direction. The load device 3 conveys the predetermined load in one direction by the motor 2 rotating positively, and the load device 3 moves in a reverse direction in a state without the predetermined load by the motor 2 rotating negatively. In this case, load inertia is different between when the motor 2 is rotating positively and when the motor 2 is rotating negatively.

Therefore, the holding unit 131 holds in advance impulse response information gimp1 at the time when a conveyance device loaded with the predetermined load is used as the load device 3, and impulse response information gimp2 at the time when a conveyance device without being loaded with the predetermined load is used as the load device 3. Then, the rotational direction (positive rotation or negative rotation) of the motor 2 is set as the driving state of the control object 6. Moreover, in the calculation processing shown in FIG. 7, if the rotational direction of the motor 2 is positive, the impulse response information gimp1 is selected and the convolution processing in S104 to S106 is performed; if the rotational direction of the motor 2 is negative, the impulse response information gimp2 is selected and the convolution processing of S104 to S106 is performed.

According to the above, the time response of the simulation system 130 is calculated using the impulse response information that suitably reflects the driving state of the actual control object 6. As a result, accuracy of calculation of the time response of the simulation system 130 is improved.

Example 2-2

In Example 2-2, as in Example 2-1, the load device 3 is set as a conveyance device having a table configured to reciprocate via a ball screw. Since the ball screw is relatively long, according to the position of the table to which a nut of the ball screw is attached, mechanical frequency characteristics of the load device 3 vary greatly. Therefore, in order to obtain a highly accurate simulation result, the holding unit 131 has a plurality of pieces of impulse response information gimp of the control object 6 according to the table position at the ball screw, and, with the table position as the driving state of the control object 6, the impulse response information gimp suitable for the driving state is selected.

Specifically, a movable range of the load device 3 at the ball screw from a starting point to an end point is divided into two sections R1 and R2. The holding unit 131 holds two pieces of impulse response information gimp1 and gimp2 respectively corresponding to each section, and the table position calculated from the position of the motor 2 is taken as the driving state of the control object 6. Moreover, in the calculation processing shown in FIG. 7, in the case where the motor 2 is rotated in the same direction, if the table position belongs to R1 and R2, respectively, the impulse response information gimp1 and the impulse response information gimp2 are respectively selected, and the impulse response information used for the convolution processing in S104 to S106 is switched. Also, in the case where the motor 2 is rotated in the reverse direction, similarly, the impulse response information according to the table position is selected, and the impulse response information used for the convolution processing in S104 to S106 will be switched.

According to the above, the time response of the simulation system 130 is calculated using the impulse response information that suitably reflects the driving state of the actual control object 6. As a result, accuracy of calculation of the time response of the simulation system 130 is improved.

Example 2-3

Figure 8:
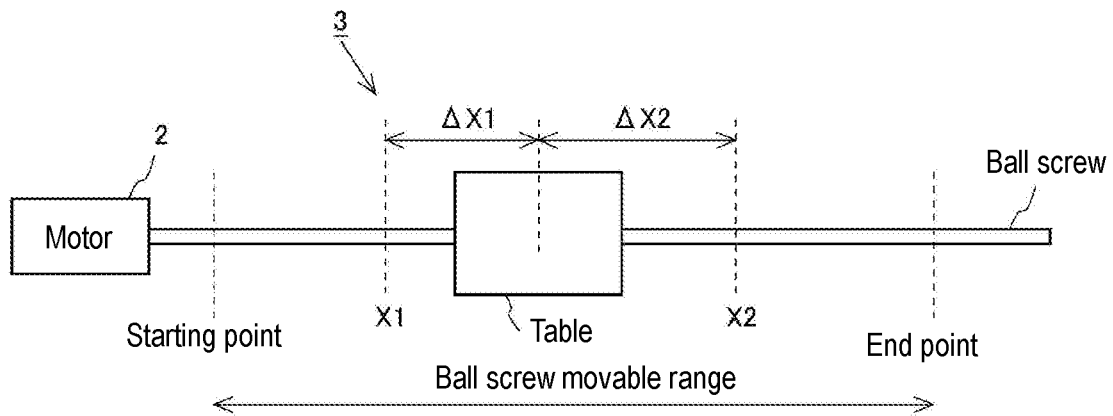
FIG. 8 is a diagram showing a schematic configuration of a conveyance device driven by a motor.

In Example 2-3, as shown in FIG. 8, the load device 3 is a conveyance device having a table configured to reciprocate via a ball screw. The holding unit 131 holds the impulse response information gimp1 when the table is located at point X1, and further holds the impulse response information gimp2 when the table is located at point X2. The point X1 is a point near the starting point side of the ball screw, and the point X2 is a point near the end point side of the ball screw. The table position calculated from the position of the motor 2 is taken as the driving state of the control object 6. Accordingly, the points X1 and X2 correspond to reference driving states of the present invention.

Moreover, in the calculation processing shown in FIG. 7, if the motor 2 is rotated and the table is moved, based on a correlation between the table position and the points X1 and X2 at which the two pieces of impulse response information are acquired, the impulse response information used for the convolution processing in S104 to S106 is selected from among the impulse response information held by the holding unit 131. Specifically, if the table position is between the starting point of the ball screw and the point X1, the impulse response information gimp1 is selected; if the table position is between the end point of the ball screw and the point X2, the impulse response information gimp2 is selected. In addition, if the table position is between the points X1 and X2, the impulse response information is selected based on distances $\Delta X1$ and $\Delta X2$ between the table position and the points X1 and X2 respectively. Specifically, if the distance $\Delta X1$ between the table and the point X1 is shorter than the distance $\Delta X2$ between the table and the point X2, the impulse response information gimp1 is selected; if the distance $\Delta X1$ between the table and the point X1 is equal to or longer than the distance $\Delta X2$ between the table and the point X2, the impulse response information gimp2 is selected.

In addition, with respect to the selection of the impulse response information in the case where the table position is between the points X1 and X2, the distances $\Delta X1$ and $\Delta X2$ between the table position and the points X1 and X2 respectively may be evaluated in accordance with another evaluation method, and either of the impulse response information gimp1 and the impulse response information gimp2 may be selected based on the evaluation result.

According to the above, the time response of the simulation system 130 is calculated using the impulse response information that suitably reflects the driving state of the actual control object 6. As a result, accuracy of calculation of the time response of the simulation system 130 is improved.

Example 2-4

Figure 9:
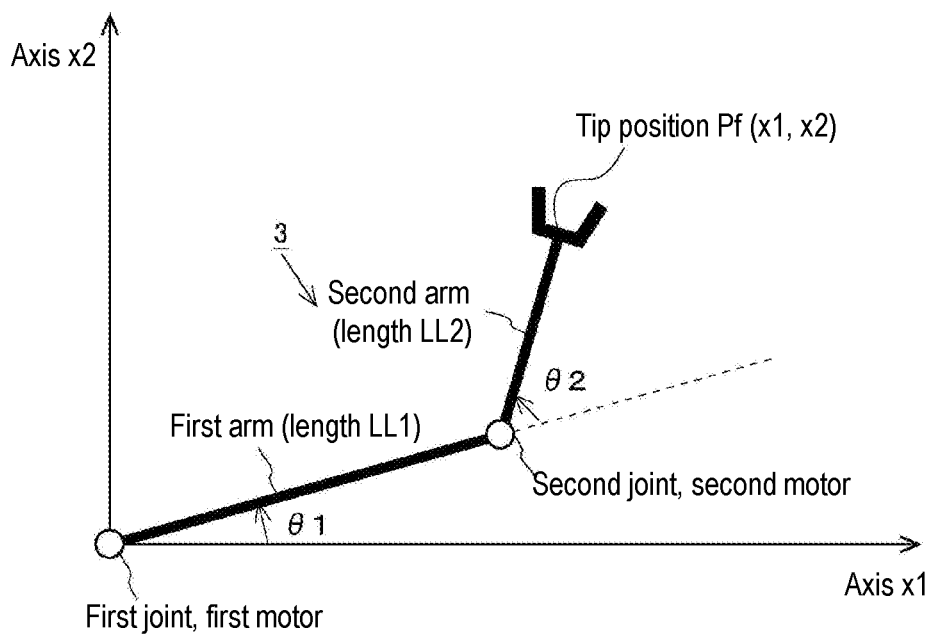
FIG. 9 is a diagram showing a schematic configuration of a robot arm driven by two motors.

In Example 2-4, as shown in FIG. 9, the load device 3 is a manipulator device, wherein a first arm is connected to a first joint, and the first joint is driven by a first motor. Further, the first arm and a second arm are connected by a second joint and the second joint is driven by a second motor. An end effector is disposed at a tip of the second arm, and an operation such as picking of an object or the like is executed. In such a manipulator device that is the load device 3, it is important how to position a tip position Pf for the purpose of picking the object or the like. In addition, since the manipulator device has redundant degrees of freedom, a correlation between the tip position Pf and rotation angles $\theta 1$ and $\theta 2$ of the arms is not necessarily uniquely determined. Hence, in the case of simulating a time response of a tip position of the manipulator device by the processing device 10, when the plurality of pieces of impulse response information held by the holding unit 131 are switched to perform the above-mentioned convolution processing, it is difficult to switch the impulse response information with the rotation angles $\theta 1$ and $\theta 2$ as the driving state of the control object 6.

Therefore, in the present embodiment, concerning the switching of the impulse response information, the selection of the plurality of pieces of impulse response information held by the holding unit 131 and the switching of the impulse response information for convolution processing are performed with the tip position Pf of the manipulator device, instead of the rotation angles $\theta 1$ and $\theta 2$, as the driving state of the control object 6. Specifically, first of all, the plurality of pieces of impulse response information held by the holding unit 131 are held in a state associated with the tip position Pf of the manipulator device. Then, in the calculation processing shown in FIG. 7, when the first joint and the second joint are driven by the first motor and the second motor, the tip position Pf is uniquely determined. Therefore, the tip position is used as the driving state of the control object 6, for example, for the tip position Pf of the manipulator device, the impulse response information that corresponds to a tip position among a plurality of tip positions associated with the held plurality of pieces of impulse response information which is closest to the tip position during the calculation processing is selected, and the selected impulse response information is used for the convolution processing in S104 to S106 of the calculation processing. Moreover, an evaluation method for selecting the impulse response information is not limited to the above-mentioned method.

According to the above, regarding the control object 6 including the load device 3 having redundant degrees of freedom, such as a manipulator device, the time response of the simulation system 130 is also calculated using the impulse response information that suitably reflects the driving state of the actual control object 6. As a result, accuracy of calculation of the time response of the simulation system 130 is improved.

Example 2-5

In the embodiments so far described, the impulse response information used in the convolution processing of the calculation processing shown in FIG. 7 is one piece of impulse response information selected from among the plurality of pieces of impulse information held by the holding unit 131, based on the driving state of the control object 6, and according to this selection, the impulse response information used in the convolution processing will be switched. In such a form, when the impulse response information is switched, depending on the degree of difference in the impulse response information before and after switching, a response calculated by the calculation unit 134 may vibrate or become unstable. Therefore, in the present embodiment, in the case of switching from one piece of impulse response information held by the holding unit 131 to another piece of impulse response information, the switching may be performed gradually rather than suddenly.

For example, taking the conveyance device shown in the above-mentioned Example 2-3 as an example, if the table position is between the points X1 and X2, new impulse response information is synthesized based on the distances $\Delta X1$ and $\Delta X2$ between the table position and the points X1 and X2 respectively. Specifically, based on a ratio between the distance $\Delta X1$ between the table and the point X1 and the distance $\Delta X2$ between the table and the point X2, a new impulse response Newgimp is calculated in accordance with the following Equation 6 (the processing in S302 in FIG. 7).

Newgimp=$\Delta X1/(\Delta X1+\Delta X2)$·gimp1+$\Delta X2/(\Delta X1+\Delta X2)$·gimp2     (Equation 6)

Then, the new impulse response Newgimp calculated in accordance with Equation 6 will be used in the subsequent convolution processing in S104 to S106 in FIG. 7.

According to the above, the time response of the simulation system 130 is more stably calculated using the impulse response information that suitably reflects the driving state of the actual control object 6. As a result, accuracy of calculation of the time response of the simulation system 130 is improved.

Figure 10:
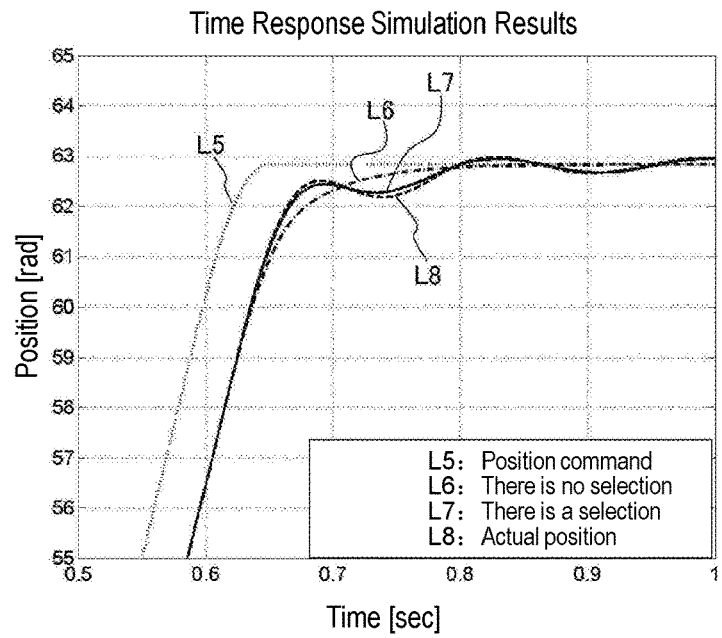
FIG. 10 is a diagram showing a simulation result by the calculation processing shown in FIG. 7 in a simulation device according to the present invention.

Here, FIG. 10 shows a simulation result when the calculation processing in Example 2-3 is executed. The horizontal axis in FIG. 10 represents time, and the vertical axis represents the response position psim. Here, line L5 in FIG. 10 represents a transition of the position command pcmd, line L6 represents a transition of a response position in the case where selection and switching of the impulse response information are not performed, and line L7 represents a transition of the response position in the case where the selection and switching of the impulse response information are performed. In addition, line L8 represents a transition of the actual response position. As can be grasped from FIG. 10, by using the table position as the driving state of the control object 6, selecting the impulse response information according to the table position, switching the impulse response information and performing convolution processing, a simulation result more compliant with mechanical characteristics of the actual machine can be obtained.

Example 3

Figure 11:
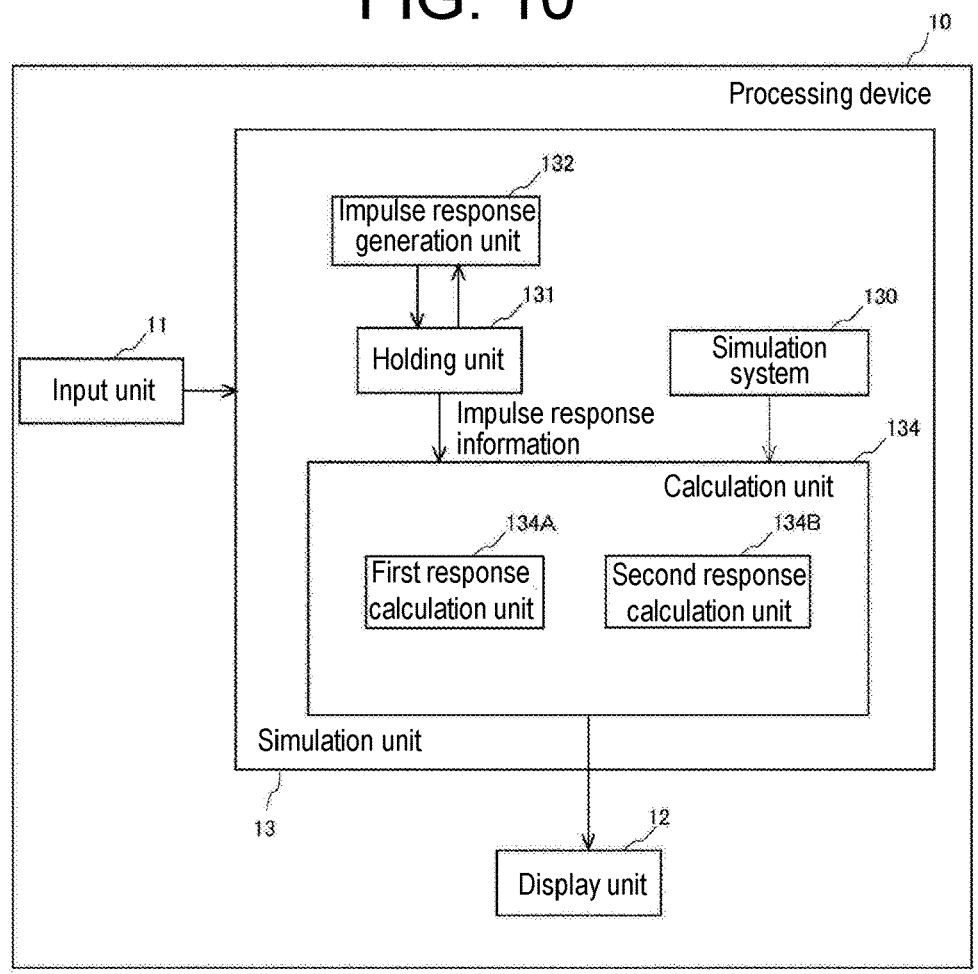
FIG. 11 is a second functional block diagram of a simulation device according to the present invention.

Next, a second functional block diagram relating to the processing device 10 is shown in FIG. 11. Among the functional units included in the processing device 10 of the present embodiment, substantially the same processing as those of the functional units included in the processing device 10 shown in Example 1 and Example 2 are denoted by the same reference numerals, and the detailed description thereof is omitted. In contrast with the processing device 10 so far described, the processing device 10 of the present embodiment further includes an impulse response generation unit 132. The impulse response generation unit 132 is a functional unit utilizing the impulse response information held by the holding unit 131 to generate new impulse response information, and the generated impulse response information will be newly held by the holding unit 131.

In the following, generation processing of new impulse response information by the impulse response generation unit 132 is explained according to a plurality of Examples.

Example 3-1

Figure 12:
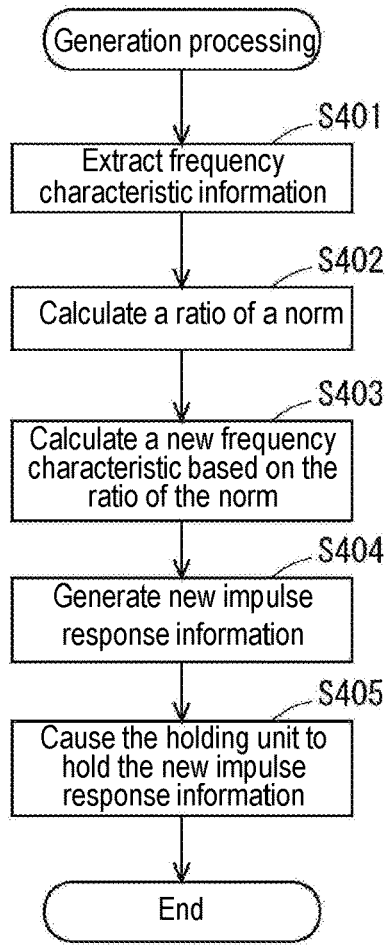
FIG. 12 is a first flowchart for generation processing executed by the simulation device shown in FIG. 11.
Figure 13:
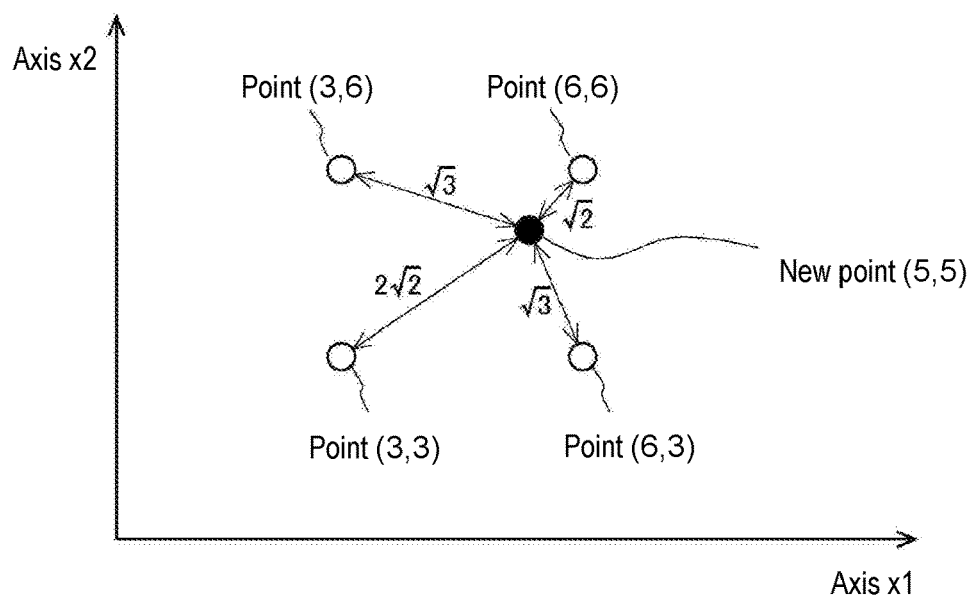
FIG. 13 is a diagram for explaining a norm ratio for calculating a new frequency characteristic in the generation processing shown in FIG. 12.
Figure 14:
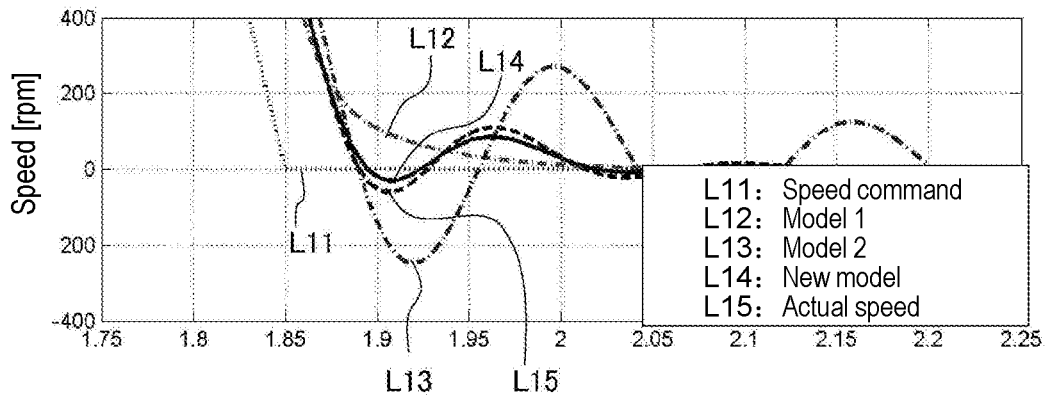
FIG. 14 is a diagram showing a simulation result by the calculation processing shown in FIG. 5B in a case of using new impulse response information generated by the generation processing shown in FIG. 12.

A first example of the generation processing is explained based on FIG. 12 to FIG. 14. FIG. 12 is a flowchart of the first generation processing; FIG. 13 is a diagram as an image of a norm ratio for generating new impulse response information in the generation processing; and FIG. 14 is a diagram showing a simulation result by the processing device 10 obtained utilizing the new impulse response information generated by the generation processing.

The generation processing shown in FIG. 12 is executed with a generation instruction input by the user via the input unit 11 being used as a trigger. This generation instruction contains what kind of impulse response information is newly generated and a generation condition for the new impulse response information. One example of the generation condition is a new driving state different from the driving state of the control object 6 corresponding to the already held impulse response information, and contains information relating to the driving state (hereinafter referred to as "generation object driving state") of the control object 6 corresponding to the new impulse response information generated by the generation processing.

First of all, in S401, the impulse response generation unit 132 extracts frequency characteristic information from the information held by the holding unit 131. As mentioned so far, the holding unit 131 holds a plurality of pieces of impulse response information. In the present embodiment, the holding unit 131 also holds, together with the plurality of pieces of impulse response information, the frequency characteristic information relating to the frequency transfer function, which is basic information for generating each piece of impulse response information via the inverse Fourier transform. In the holding operation, the relevance between impulse response information and the corresponding frequency characteristic information is maintained. In the present embodiment, if it is assumed that four pieces of impulse response information are held in the holding unit 131, the frequency characteristic information corresponding to the four pieces of impulse response information is extracted in S401. When the processing in S401 ends, the processing proceeds to S402.

In S402, a ratio of a norm (distance) between a generation object driving state input as a generation condition and the driving state of the control object 6 corresponding to each piece of the impulse response information currently held in the holding unit 131 is calculated. The calculation of the ratio of the norm is explained based on FIG. 13. FIG. 13 shows the driving state of the control object 6 corresponding to the four pieces of impulse response information currently held in the holding unit 131, wherein output positions of the load device 3 are represented by four white circles (points (3, 3), (6, 3), (3, 6), and (6, 6)). When a generation instruction to generate impulse response information corresponding to a point (5, 5) that is a new driving state of the control object 6, that is, the generation object driving state, is input by the user, the norms (distances) between the new point (5, 5) and the other four points are calculated, and the ratios thereof are calculated. In the example shown in FIG. 13, the ratios of the norms are calculated as $\sqrt{2}:\sqrt{3}:\sqrt{3}:2\sqrt{2}=16:26:26:32$. When the processing in S402 ends, the processing proceeds to S403.

In S403, new frequency characteristic information corresponding to the generation object driving state (in the example shown in FIG. 13, the new point (5, 5)) contained in the generation condition is calculated in accordance with the following Equation 7 using the ratios of the norms calculated in S402.

$$NewFw=\Sigma(RNorm \cdot Fw) \quad \text{(Equation 7)}$$

However, NewFw is the new frequency characteristic information; RNorm represents the ratio of each norm in percentage; and Fw is the frequency characteristic information corresponding to each norm and is extracted from the holding unit 131 by the processing in S401. That is, Equation 7 is an equation calculating new frequency characteristic information by weighted averaging existing frequency characteristic information based on a ratio of a norm.

In the above-mentioned example, when the respective frequency characteristics of the points (3, 3), (6, 3), (3, 6) and (6, 6) are set as Fw1, Fw2, Fw3 and Fw4, respectively, the new frequency characteristic NewFw corresponding to the new point (5, 5) is calculated as follows.

$$NewFw=0.16Fw1+0.26Fw2+0.26Fw3+0.32Fw4$$

Next, in S404, by subjecting the new frequency characteristic calculated in S403 to an inverse Fourier transform, the new impulse response information corresponding to the generation object driving state (in the example shown in FIG. 13, the new point (5, 5)) is generated. Then, in S405, the newly generated impulse response information and the frequency characteristic information as the basic information therefor are associated with each other and held in the holding unit 131. Accordingly, the calculation unit 134 can use the new impulse response information for the convolution processing in the calculation processing shown in FIG. 5A, FIG. 5B and FIG. 7. Accordingly, even if the user does not directly measure or acquire the impulse response information corresponding to the generation object driving state, since the desired impulse response information can be generated by utilizing the existing holding information, it is possible to greatly reduce the effort required to acquire a highly accurate simulation result.

Here, in FIG. 14, a simulation result of the speed response by the calculation processing shown in FIG. 5B in the case where the new impulse response information is generated by the generation processing in Example 3-1 is shown. Specifically, in the holding unit 131, as the driving state of the control object 6, the impulse response information in the case (model 1) where the load inertia is 0.00064 kgm$^2$ and the impulse response information in the case (model 2) where the load inertia is 0.0064 kgm$^2$ are held together with the load inertia values which is the driving state thereof. These pieces of impulse response information are information obtained by measuring the mechanical frequency characteristics of the actual machine. Then, it is assumed that, by the generation processing, an impulse response model is generated in the case (new model) where the load inertia is 0.0019 kgm$^2$, and is newly held in holding unit 131.

Then, a speed response of each model is calculated by calculation processing and is shown in FIG. 14. The horizontal axis in FIG. 14 represents time, and the vertical axis represents response speed. Line L11 in FIG. 14 represents a transition of the speed command vcmd, line L12 represents a transition of the speed response corresponding to the model 1, line L13 represents a transition of the speed corresponding to the model 2, and line L14 represents a transition of the speed of the new model. In addition, line L15 represents an actual transition of the speed of the actual machine whose load inertia is 0.0019 kgm$^2$ as in the new model. It is known from the above that, in the actual machine corresponding to the new model, by executing calculation processing by using the impulse response model obtained in the above-mentioned generation processing without measuring the actual mechanical frequency characteristics, a simulation result suitably approximating to the speed response of the actual machine can be obtained.

Example 3-2

Figure 15:
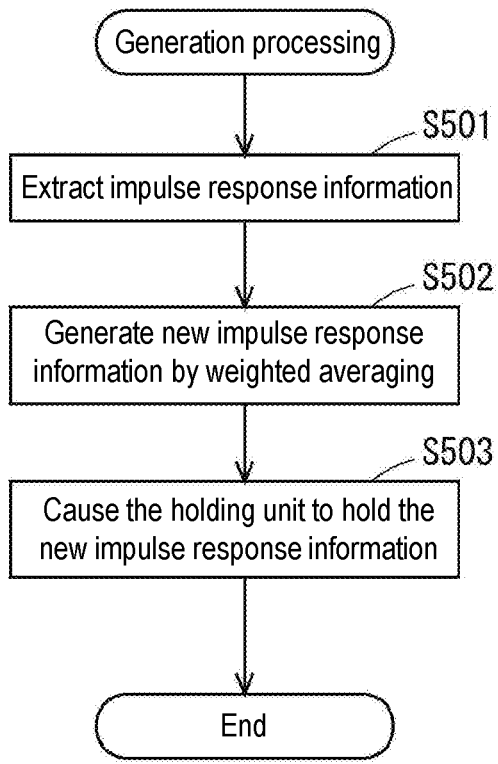
FIG. 15 is a second flowchart for generation processing executed by the simulation device shown in FIG. 11.

A second example of the generation processing is explained based on FIG. 15. FIG. 15 is a flowchart of the second generation processing. Similarly to the generation processing shown in FIG. 12, the generation processing shown in FIG. 15 is also executed with a generation instruction from the user input via the input unit 11 being used as a trigger, and this generation instruction contains the information relating to the generation object driving state as the generation condition for the new impulse response information.

First of all, in S501, the impulse response generation unit 132 extracts a plurality of pieces of impulse response information from the information held by the holding unit 131, as in S401 mentioned above. After that, in S502, by subjecting the plurality of pieces of impulse response information extracted in S501 to weighted averaging based on the generation object driving state, new impulse response information is generated. For example, with respect to the two pieces of impulse response information corresponding to the model 1 and the model 2 shown in Example 3-1 mentioned above, a ratio for weighted averaging is determined based on the load inertia of the new model, and the ratio is utilized to generate the impulse response information for the new model. The ratio for weighted averaging can be determined by properly evaluating a correlation between the load inertia of the model 1 and the model 2 and the load inertia of the new model.

Then, in S503, the newly generated impulse response information is held in the holding unit 131. Accordingly, the calculation unit 134 can use the new impulse response information for the convolution processing in the calculation processing shown in FIG. 5A, FIG. 5B and FIG. 7. Accordingly, even if the user does not directly measure or acquire the impulse response information corresponding to the generation object driving state, since the desired impulse response information can be generated by utilizing the existing holding information, it is possible to greatly reduce the effort required to acquire a highly accurate simulation result. In addition, since frequency characteristic information is not utilized as in Example 3-1, it is possible to generate new impulse response information relatively easily.

What is claimed is:

1. A simulation device, simulating a control system having a control object comprising a motor and a motor control device controlling the motor, wherein the simulation device comprises:
    a simulation system, comprising a predetermined feedback system having, as a forward element, at least a predetermined control block structure corresponding to a predetermined device-side configuration comprising the control object;
    a holding unit, comprising a memory, holding impulse response information for calculation which is information on an impulse response relating to the predetermined device-side configuration;
    a processor configured to function as:
    a first response calculation unit, calculating a time response of the predetermined device-side configuration to a predetermined input value by convolution processing using the impulse response information for calculation and the predetermined input value; and
    a second response calculation unit, calculating a response of the simulation system to a command value input to the simulation system by using the time response of the predetermined device-side configuration calculated by the first response calculation unit.

2. The simulation device according to claim 1, wherein the second response calculation unit, in the predetermined feedback system, calculates the response of the simulation system in accordance with a method of feeding back the time response of the predetermined device-side configuration or a predetermined response result calculated from the time response to an input side of the forward element.

3. The simulation device according to claim 2, wherein the impulse response is an impulse response to a current command;
    the predetermined feedback system is a speed feedback system, and comprises, as the forward element in the predetermined feedback system, the predetermined control block structure and a speed control block structure relating to speed compensation;
    the second response calculation unit calculates a time response of the simulation system so that a speed response calculated by the first response calculation unit is fed back to the speed control block structure in accordance with the feedback method.

4. The simulation device according to claim 2, wherein the impulse response is an impulse response to a speed command;
    the predetermined feedback system is a position feedback system, and comprises, as the forward element in the predetermined feedback system, the predetermined control block structure and a position control block structure relating to position compensation;
    the second response calculation unit calculates a time response of the simulation system so that a position response based on the speed response calculated by the first response calculation unit is fed back to the position control block structure in accordance with the feedback method.

5. The simulation device according to claim 1, wherein the holding unit holds, as the impulse response information for calculation, a plurality of patterns of impulse response information;
    the first response calculation unit selects predetermined impulse response information from among the plurality of patterns of impulse response information owned by the holding unit based on a driving state of the control object, and executes the convolution processing by using the selected predetermined impulse response information and the predetermined input value.

6. The simulation device according to claim 5, wherein the plurality of patterns of impulse response information are respectively associated with a plurality of reference driving states which are different driving states of the control object;
    the first response calculation unit selects the predetermined impulse response information based on a correlation between the driving state of the control object and each of the plurality of reference driving states.

7. The simulation device according to claim 6, wherein the control object comprises a driving object machine driven by a plurality of the motors;
    the plurality of patterns of impulse response information are respectively associated with the plurality of reference driving states relating to a state amount of a predetermined portion of the driving object machine;
    the first response calculation unit selects the predetermined impulse response information based on a correlation between the state amount of the predetermined portion of the driving object machine and each of the plurality of reference driving states.

8. The simulation device according to claim 1, wherein the holding unit holds, as the impulse response information for calculation, a plurality of patterns of impulse response information;
    the first response calculation unit selects at least two pieces of impulse response information from among the plurality of patterns of impulse response information owned by the holding unit based on a driving state of the control object, synthesizes new impulse response information according to the driving state of the control object from the selected at least two pieces of impulse response information, and executes the convolution processing by using the synthesized new impulse response information and the predetermined input value.

9. The simulation device according to claim 1, wherein the holding unit holds, as the impulse response information for calculation, a plurality of patterns of impulse response information associated with a plurality of reference driving states which are different driving states of the control object, and holds frequency characteristic information associated with each of the plurality of patterns of impulse response information and the plurality of pieces of reference driving states and capable of generating the various impulse response information;

wherein the simulation device, based on a correlation between a driving state of the control object and each of at least two of the plurality of reference driving states, generating, from the frequency characteristic information associated with the at least two reference driving states, new frequency characteristic information corresponding to the driving state of the control object, and generating new impulse response information corresponding to the driving state of the control object based on the generated new frequency characteristic information;

the first response calculation unit executes the convolution processing by using the new impulse response information generated and the predetermined input value.

10. The simulation device according to claim 9, wherein based on the correlation between the driving state of the control object and each of the at least two reference driving states, the simulation device generates the new frequency characteristic information by weighted averaging the frequency characteristic information associated with the at least two reference driving states.

11. The simulation device according to claim 1, wherein the simulation device, selecting at least two pieces of impulse response information from among a plurality of patterns of impulse response information owned by the holding unit, and generating new impulse response information from the selected at least two pieces of impulse response information, wherein the holding unit holds the new impulse response information generated.

12. The simulation device according to claim 11, wherein the simulation device generates the new impulse response information by weighted averaging the at least two pieces of impulse response information.

13. A simulation method, simulating a control system having a control object comprising a motor and a motor control device controlling the motor, wherein the simulation method comprises:

calculating a time response of a predetermined device-side configuration comprising the control object to a predetermined input value, by convolution processing using impulse response information for calculation which is information on an impulse response relating to the predetermined device-side configuration and the predetermined input value; and calculating a response of the simulation system to a command value input to the simulation system, by using the time response of the predetermined device-side configuration calculated in the calculation step by the convolution processing, based on a simulation system comprising a predetermined feedback system having, as a forward element, at least a predetermined control block structure corresponding to the predetermined device-side configuration.

14. A simulation program stored on a non-transitory recording medium, causing a simulation device simulating a control system having a control object comprising a motor and a motor control device controlling the motor to execute:

a step of calculating a time response of a predetermined device-side configuration comprising the control object to a predetermined input value, by convolution processing using impulse response information for calculation which is information on an impulse response relating to the predetermined device-side configuration and the predetermined input value; and a step of calculating a response of the simulation system to a command value input to the simulation system, by using the time response of the predetermined device-side configuration calculated in the calculation step by the convolution processing, based on a simulation system comprising a predetermined feedback system having, as a forward element, at least a predetermined control block structure corresponding to the predetermined device-side configuration.

* * * * *